(12) United States Patent
Cook

(10) Patent No.: US 7,379,610 B2
(45) Date of Patent: May 27, 2008

(54) METHODS OF, AND APPARATUS FOR, PRODUCING CODE WORDS

(75) Inventor: Paul Cook, Cambridge (GB)

(73) Assignee: Ubinetics (VPT) Limited, Melbourn, Hertfordshire (GB)

( * ) Notice: Subject to any disclaimer, the term of this patent is extended or adjusted under 35 U.S.C. 154(b) by 751 days.

(21) Appl. No.: 10/451,538

(22) PCT Filed: Dec. 4, 2001

(86) PCT No.: PCT/GB01/05371

§ 371 (c)(1),
(2), (4) Date: Dec. 4, 2003

(87) PCT Pub. No.: WO02/51014

PCT Pub. Date: Jun. 27, 2002

(65) Prior Publication Data

US 2004/0071357 A1    Apr. 15, 2004

(30) Foreign Application Priority Data

Dec. 21, 2000    (GB)    ................. 0031358.5

(51) Int. Cl.
*G06K 9/46* (2006.01)
*G06K 9/36* (2006.01)
*H03M 7/12* (2006.01)
*H03M 7/04* (2006.01)

(52) U.S. Cl. ............ 382/248; 382/233; 382/281; 341/62; 341/85

(58) Field of Classification Search ........... 382/232, 382/233, 248, 281; 341/62, 83, 84, 85; 375/142
See application file for complete search history.

(56) References Cited

U.S. PATENT DOCUMENTS

| 4,933,956 A | * | 6/1990 | Forney, Jr. ............. 375/341 |
| 5,353,352 A | * | 10/1994 | Dent et al. ............ 380/37 |
| 5,594,742 A | * | 1/1997 | Hemmati ............... 714/792 |
| 5,742,678 A | * | 4/1998 | Dent et al. ............ 380/270 |
| 5,926,488 A | * | 7/1999 | Khayrallah ............ 714/752 |

(Continued)

FOREIGN PATENT DOCUMENTS

GB    2320663 A    12/1996

(Continued)

OTHER PUBLICATIONS

Be'ery, Y.—"Optimal soft decision block decoders based on fast hadamard transform"—IEEE—vol. IT-32, No. 3, May 1986, pp. 355-364.*

(Continued)

*Primary Examiner*—Jingge Wu
*Assistant Examiner*—Bernard Krasnic
(74) *Attorney, Agent, or Firm*—Banner & Witcoff, Ltd.

(57) ABSTRACT

Datawords encoded using a first-order Reed-Muller code are decoded using a Fast Hadamard Transform (FHT). Where the dataword is known to comprise a number of unused bits at one end, the soft decisions of the codeword are reordered. Majority polling is then performed on groups of the soft decisions to produce a series of soft decisions which make up a new codeword. The new codeword is then decoded using an FHT of lower order than the FHT applicable to the originally received codeword.

18 Claims, 1 Drawing Sheet

U.S. PATENT DOCUMENTS

| | | | |
|---|---|---|---|
| 6,373,859 B1* | 4/2002 | Jedwab et al. | 370/479 |
| 6,487,258 B1* | 11/2002 | Jedwab et al. | 375/340 |
| 2004/0140914 A1* | 7/2004 | Aldridge et al. | 341/50 |
| 2005/0078738 A1* | 4/2005 | Shieh et al. | 375/142 |
| 2005/0210364 A1* | 9/2005 | Kim | 714/781 |

FOREIGN PATENT DOCUMENTS

| | | |
|---|---|---|
| JP | 050161017 | 6/1993 |
| JP | 2004187022 A * | 7/2004 |

OTHER PUBLICATIONS

Ashikhmin, A.—"Fast decoding of non-binary first order Reed-Muller codes"—AAECC 7, 1996, pp. 299-308.*

* cited by examiner

METHODS OF, AND APPARATUS FOR, PRODUCING CODE WORDS

CROSS-REFERENCES TO RELATED APPLICATIONS

This application is a National Stage Application filed under 35 U.S.C. § 371 based on PCT/G01/05371 filed Dec. 4, 2001.

FIELD OF THE INVENTION

This invention relates to coding, i.e. encoding and decoding. In particular, the invention relates to decoding using a Hadamard transform.

BACKGROUND OF THE INVENTION

A binary word can be encoded using the first-order Reed-Muller code. Where the word to be encoded comprises 5 bits, a1 to a5, then the code comprises a code line for each bit, as follows:

| a1: | 1111 | 1111 | 1111 | 1111 |
|-----|------|------|------|------|
| a2: | 0101 | 0101 | 0101 | 0101 |
| a3: | 0011 | 0011 | 0011 | 0011 |
| a4: | 0000 | 1111 | 0000 | 1111 |
| a5: | 0000 | 0000 | 1111 | 1111 |

The code for a particular word is created by combining the code lines corresponding to the non zero bits of the word to be encoded. The code lines are combined by bit-wise, modulo-2 summation to produce the encoded word. For example, consider the word 10110 (a1=1, a2=0, a3=1, a4=1, a5=0). This word becomes encoded as 1100 0011 1100 0011 by combining the a1, a3 and a4 code lines. Words encoded in this manner are decoded at a receiver using a Fast Hadamard Transform, FHT.

An aim of the invention is to enhance the decoding of words using a Hadamard transform.

SUMMARY OF THE INVENTION

According to a first aspect, the invention provides a method of producing a second binary codeword from a first binary codeword destined for decoding using a Hadamard transform, the method comprising selecting soft decisions from the first codeword into one or more groups, and combining the soft decisions within each group to produce a number of resultant soft decisions forming the second codeword.

According to a second aspect, the invention also provides apparatus for producing a second binary codeword from a first binary codeword destined for decoding using a Hadamard transform, the apparatus comprising selecting means for selecting soft decisions from the first codeword into one or more groups, and combining means for combining the soft decisions of each group to produce a number of resultant soft decisions forming the second codeword.

By manipulating a first codeword in this way, a second codeword is produced which can be decoded optimally in terms of error recovery even where the dataword encoded as the first codeword has a number of unused bits at one end.

An example of a coding system in which the invention can be used is TFCI decoding in third generation mobile telecommunications (UMTS). The TFCI is a 10 bit dataword encoded into a 32 bit codeword. The first 6 bits of the TFCI word are encoded using the first order Reed-Muller code. Many channels use less than 6 bits for the TFCI and the invention can be used to gain improved error recovery in such cases.

In one embodiment, the soft decisions selected for each group are a group of soft decisions that would appear consecutively in the first codeword if it were permuted by, for each soft decision in the first codeword, taking the position of said soft decision in the first codeword as a decimal number and converting said decimal number into binary number, bit reversing the binary number, and converting the reversed binary number into a decimal number giving the position of said soft decision in the permuted codeword.

In a preferred embodiment, the first codeword is permuted by, for each soft decision in the first codeword, moving said soft decision by a process of, or equivalent to, taking the position of the soft decision in the first codeword as a decimal number and converting said decimal number into binary number, bit reversing the binary number, and converting the reversed binary number into a decimal number giving the position of said soft decision in the permuted codeword, and thereafter the soft decisions of the permuted codeword are grouped by selecting groups of consecutive soft decisions from the permuted codeword.

In one embodiment, the combining operation comprises generating each soft decision of the second codeword from a group of soft decisions by summing the soft decisions of the group. The size of the groups may depend upon the number of unused bits at one end of a dataword encoded as the first codeword.

The first codeword may be produced by encoding a dataword using the first order Reed-Muller code.

The invention also extends to using a Hadamard transform to decode the manipulated codeword. The invention can also be encoded on a computer-readable medium.

DETAILED DESCRIPTION OF THE INVENTION

Figure 1:
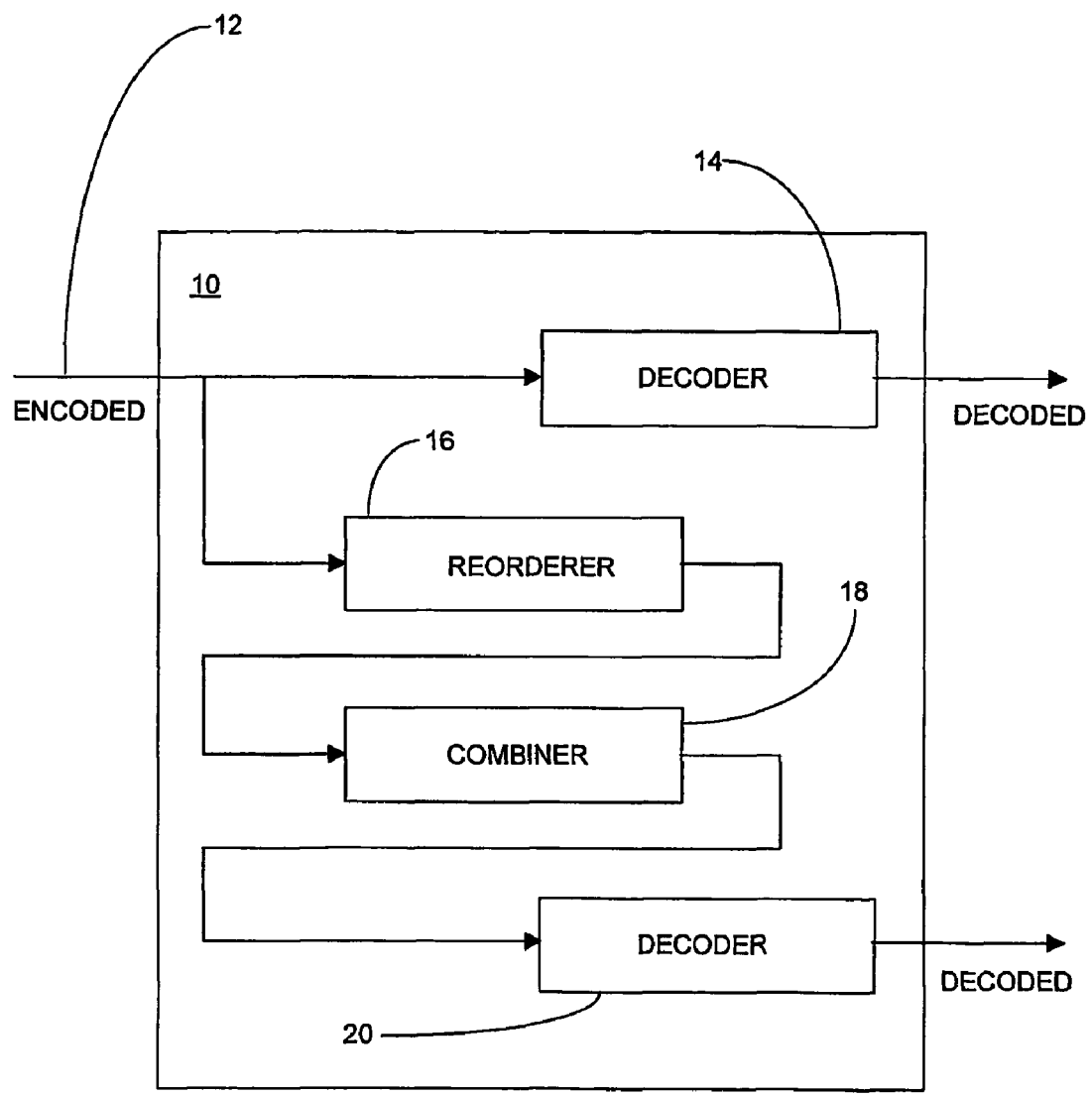
FIG. 1. is a schematic diagram of the decoder.

By way of example only, an embodiment of the invention will now be described with reference to the accompanying figure which shows a receiver having a decoder employing a Fast Hadamard Transform (FHT).

As shown in FIG. 1, receiver 10 receives a stream of soft decisions 12. The soft decisions 12 originate from the transmission by a transmitter (e.g. a base station in a wireless telephony system) of a series of 5 bit datawords, each of which has been encoded by the first-order Reed-Muller code to produce a corresponding 16 bit codeword. The stream of soft decisions therefore comprises a series of codewords, each 16 soft decisions long. The receiver 10 decodes the codewords in the soft decision stream 12 using a Hadamard transform, thereby recovering the datawords.

Where each of the 32 possible datawords is equally likely, then a standard, 16-point FHT decodes the codewords optimally, in terms of error recoverability. However, the 16-point FHT will not be optimal in cases where the encoded dataword is known to use only a portion at the least significant end of the dataword (e.g., the most significant bit is not used).

When the receiver 10 decodes a codeword relating to a dataword which uses all 5 bits, then the decoding process is performed using a decoder 14 operating a 16-point FHT algorithm. When the receiver 10 decodes a codeword relating to a dataword which does not use at least the most significant bit, then the codeword is decoded in a different way, by first passing the codeword to permuting unit 16.

The permuting unit 16 permutes the soft decisions (SDs) of a codeword in the following way. A codeword contains 16 SDs in positions numbered from 0 to 15 in decimal notation. The SDs are permuted within the codeword in the manner indicated by the following table. The top row of the table indicates the positions of the SDs in the codeword as received by the permuting unit 16, and the bottom row indicates the order of those SDs in the permuted codeword.

| Received | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| Permuted | 0 | 8 | 4 | 12 | 2 | 10 | 6 | 14 | 1 | 9 | 5 | 13 | 3 | 11 | 7 | 15 |

Effectively then, the decimal number of each position is converted to a binary number, which is subsequently reversed and converted back to a decimal number which is the position of the SD in the permuted codeword. Consider the SD at position 05 in a received codeword. When the codeword is permuted, the SD is transferred thus: 05→0101→1010→10, i.e. to position 10 in the permuted codeword. All of the SDs of the received codeword are permuted in this way, as indicated by the above table.

The effect of the permutation can be considered the same as taking the codelines used to produce the codewords, other than that for the most significant bit of the dataword, and reversing their order. For example, referring to the scheme used in the introduction where 5 bit datawords are encoded using corresponding codelines a1 to a5, the effect of permuting the codewords is equivalent to producing the codewords by an alternative set of codelines c1 to c5, where c1=a1, c2=a5, c3=a4, c4=a3, and c5=a2.

The combiner 18 divides up the permuted codeword into groups of SDs. The number of groups depends on the number of non-used bits at the most significant end of the dataword represented by the codeword. Where only the 4 least significant bits are used in the dataword, then the codeword is divided into 8 groups of 2 SDs. Where only the 3 least significant bits are used in the dataword, then the codeword is divided into 4 groups of 4 SDs. Where only the 2 least significant bits are used in the dataword, then the codeword is divided into 2 groups of 8 SDs. Where the least significant bit only is used in the dataword, then the codeword is treated as a single group of 16 SDs.

Each group contains consecutive SDs from the permuted codeword. The combiner 18 performs majority polling on the SDs in each group. Each SD is represented by a word comprising a sign (positive or negative—indicating that the bit appears to be a zero or a one, respectively) and a magnitude (indicating the confidence in the decision that the bit is correctly designated a one or a zero). The majority polling comprises summing the soft decisions of a group to produce an overall soft decision representing the group. Taken together, these resultant SDs constitute a resultant codeword which is then decoded using a FHT in decoder 20.

Since the resultant codeword supplied to decoder 20 has fewer SDs than the initial codeword, it can be handled using a lower order FHT than the FHT applicable to the initial codeword. Error correction performance is improved by performing the permuting/majority polling on codewords corresponding to datawords having unused bits.

Although the embodiment described above operates with datawords of 5 bits, it will be apparent that the invention extends to systems using datawords having more or less than 5 bits.

Furthermore, although the described embodiment permutes the first codeword and then selects consecutive soft decisions for each group, it will be apparent that soft decisions may be selected directly into the groups to give the effect of the permutation followed by selection of consecutive soft decisions, but without having to use the intermediate step of having to explicitly permute the first codeword.

The invention claimed is:

1. A method of producing a second binary codeword from a first binary codeword comprising a plurality of soft decisions and destined for decoding using a Hadamard transform, the method comprising selecting soft decisions from the first binary codeword into one or more groups and combining the soft decisions within each group to produce a number of resultant soft decisions forming the second binary codeword, wherein the soft decisions selected for each group are those soft decisions that would appear as a consecutive group in the first codeword if the first codeword were permuted by, for each soft decision in the first codeword, taking a position of said soft decision in the first codeword as a decimal number and converting said decimal number into a binary number, bit reversing the binary number, and converting the bit reversed binary number into a decimal number giving the position of said soft decision in the permuted version of the first codeword.

2. The method according to claim 1 wherein the combining of a group of soft decisions comprises summing the soft decisions in the group.

3. The method according to claim 2, wherein a size of the groups is dependent upon the number of unused bits at one end of a dataword encoded into the first codeword.

4. The method according to claim 3, wherein the first codeword is produced by encoding the dataword using a Reed-Muller algorithm.

5. A method of producing a second binary codeword from a first binary codeword comprising a plurality of soft decisions and destined for decoding using a Hadamard transform, the method comprising selecting soft decisions from the first binary codeword into one or more groups and combining the soft decisions within each group to produce a number of resultant soft decisions forming the second binary codeword, the method further comprising steps of permuting the first codeword by for each soft decision in the first codeword moving said soft decision by a process of taking a position of said soft decision in the first codeword as a decimal number and converting said decimal number into a binary number, bit reversing the binary number, and converting the bit reversed binary number into a decimal number giving the position of said soft decision in the permuted codeword, and wherein the selecting step comprises selecting groups of consecutive soft decisions from the permuted version of the first codeword.

6. The method according to claim 5 wherein the combining of a group of soft decisions comprises summing the soft decisions in the group.

7. The method according to claim 6, wherein a size of the groups is dependent upon the number of unused bits at one end of a dataword encoded into the first codeword.

8. The method according to claim 7, wherein the first codeword is produced by encoding the dataword using a Reed-Muller algorithm.

9. A method of producing a second binary codeword from a first binary codeword comprising a plurality of soft decisions and destined for decoding using a Hadamard transform, the apparatus comprising a selector for selecting soft decisions from the first binary codeword into one or more groups and a combiner for combining the soft decisions within each group to produce a number of resultant soft decisions forming the second binary codeword, wherein the selector is configured so that the soft decisions selected for each group are those soft decisions that would appear as a consecutive group in the first codeword if the first codeword were permuted by, for each soft decision in the first codeword, taking a position of said soft decision in the first codeword as a decimal number and convening said decimal number into a binary number, bit reversing the binary number, and convening the bit reversed binary number into a decimal number giving the position of said soft decision in the permuted version of the first codeword.

10. The apparatus according to claim 9, wherein the combiner is configured to combine a group of soft decisions by summing the soft decisions within the group.

11. The apparatus according to claim 10, wherein a size of the groups is dependent on the number of unused bits at one end of a dataword encoded into the first codeword.

12. The apparatus according to claim 11, wherein the first codeword is produced by encoding the dataword using a Reed-Muller algorithm.

13. A method of producing a second binary codeword from a first binary codeword comprising a plurality of soft decisions and destined for decoding using a Hadamard transform, the apparatus comprising a selector for selecting soft decisions from the first binary codeword into one or more groups and a combiner for combining the soft decisions within each group to produce a number of resultant soft decisions forming the second binary codeword, wherein the selector comprises a permutor that permutates the first codeword by, for each soft decision in the first codeword, moving said soft decision by a process of taking a position of said soft decision in the first codeword as a decimal number and convening said decimal number into a binary number, bit reversing the binary number, and convening the bit reversed binary number into a decimal number giving the position of said soft decision in the permuted codeword and an allocator for assigning a series of consecutive soft decisions of the permuted version of the first codeword to form each group.

14. The apparatus according to claim 13, wherein the combiner is configured to combine a group of soft decisions by summing the soft decisions within the group.

15. The apparatus according to claim 14, wherein a size of the groups is dependent on the number of unused bits at one end of a dataword encoded into the first codeword.

16. The apparatus according to claim 15, wherein the first codeword is produced by encoding the dataword using a Reed-Muller algorithm.

17. A computer-readable medium encoded with computer-executable instructions for causing a data processing apparatus to perform a method of producing a second binary codeword for a first binary codeword comprising a plurality of soft decisions and destined for decoding using a Hadamard transform, the method comprising selecting soft decisions from the first binary codeword into one or more groups and combining the soft decisions within each group to produce a number of resultant soft decisions forming the second binary codeword, wherein the soft decisions selected for each group are those soft decisions that would appear as a consecutive group in the first codeword if the first codeword were permuted by, for each soft decision in the first codeword, taking a position of said soft decision in the first codeword as a decimal number and converting said decimal number into a binary number, bit reversing the binary number, and converting the bit reversed binary number into a decimal number giving the position of said soft decision in the permuted version of the first codeword.

18. A computer-readable medium encoded with computer-executable instructions for causing a data processing apparatus to perform a method of producing a second binary codeword for a first binary codeword comprising a plurality of soft decisions and destined for decoding using a Hadamard transform, the method comprising selecting soft decisions from the first binary codeword into one or more groups and combining the soft decisions within each group to produce a number of resultant soft decisions forming the second binary codeword, the method further comprising steps of permuting the first codeword by, for each soft decision in the first codeword, moving said soft decision by a process of taking a position of said soft decision in the first codeword as a decimal number and converting said decimal number into a binary number, bit reversing the binary number, and converting the bit reversed binary number into a decimal number giving the position of said soft decision in the permuted codeword, and wherein the selecting step comprises selecting groups of consecutive soft decisions from the permuted version of the first codeword.

* * * * *